US010763082B2

(12) United States Patent
Liao et al.

(10) Patent No.: US 10,763,082 B2
(45) Date of Patent: Sep. 1, 2020

(54) CHAMBER OF PLASMA SYSTEM, LINER FOR PLASMA SYSTEM AND METHOD FOR INSTALLING LINER TO PLASMA SYSTEM

(71) Applicant: Taiwan Semiconductor Manufacturing Co., Ltd., Hsinchu (TW)

(72) Inventors: Chung-Hsien Liao, Hsinchu (TW); Wen-Pao Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 524 days.

(21) Appl. No.: 15/060,608

(22) Filed: Mar. 4, 2016

(65) Prior Publication Data

US 2017/0256383 A1  Sep. 7, 2017

(51) Int. Cl.
*H01J 37/32* (2006.01)
(52) U.S. Cl.
CPC .. *H01J 37/32431* (2013.01); *H01J 37/32082* (2013.01); *H01J 37/32467* (2013.01); *H01J 37/32477* (2013.01)
(58) Field of Classification Search
CPC .......... H01J 37/32431; H01J 37/32477; H01J 37/32467; H01J 37/32082
USPC ....................................... 118/715; 156/345.1
See application file for complete search history.

(56) References Cited

U.S. PATENT DOCUMENTS

| 5,085,887 | A | * | 2/1992 | Adams | C23C 16/481 118/620 |
| 6,129,808 | A | * | 10/2000 | Wicker | H01J 37/321 118/723 E |
| 6,383,333 | B1 | * | 5/2002 | Haino | H01J 37/32477 156/345.1 |
| 6,821,378 | B1 | * | 11/2004 | Daugherty | H01J 37/32449 118/715 |
| 8,163,087 | B2 | * | 4/2012 | Faguet | C23C 16/4401 118/715 |
| 2003/0015287 | A1 | * | 1/2003 | Haino | H01J 37/32477 156/345.1 |
| 2005/0225248 | A1 | * | 10/2005 | Fink | H01J 37/32458 315/111.21 |
| 2006/0225655 | A1 | * | 10/2006 | Faguet | C23C 16/4401 118/723 R |
| 2007/0221130 | A1 | * | 9/2007 | Nozawa | C23C 16/4401 118/719 |
| 2011/0290419 | A1 | * | 12/2011 | Horiguchi | H01J 37/3244 156/345.29 |
| 2016/0314943 | A1 | * | 10/2016 | Albarede | H01J 37/32082 |
| 2016/0319428 | A1 | * | 11/2016 | Rasheed | C23C 16/45544 |

* cited by examiner

*Primary Examiner* — Rudy Zervigon
(74) *Attorney, Agent, or Firm* — JCIPRNET (57) ABSTRACT

A chamber of a plasma system includes a chamber wall defining a plasma processing area, a substrate supporter configured to support a substrate in the plasma processing area, and a liner located in the plasma processing area and separating the chamber wall from the plasma processing area. A liner for a plasma system and a method for installing a liner to a plasma system are also provided.

20 Claims, 8 Drawing Sheets

CHAMBER OF PLASMA SYSTEM, LINER FOR PLASMA SYSTEM AND METHOD FOR INSTALLING LINER TO PLASMA SYSTEM

BACKGROUND

In the fabrication of modern semiconductor devices, the deposition of a thin layer on a semiconductor substrate by chemical reaction of gases is one of the primary steps. Such deposition process is referred to generally as chemical-vapor deposition (CVD). Typical thermal CVD processes supply reactive gases to the substrate surface where heat-induced chemical reactions take place to produce a desired layer.

Plasma-enhanced CVD (PECVD) techniques, on the other hand, promote excitation and/or dissociation of the reactant gases by the application of radio frequency ("RF") energy to a reaction zone near the substrate surface, thereby creating plasma. The high reactivity of the species in the plasma reduces the energy required for a chemical reaction to take place, and thus lowers the temperature required for such CVD processes as compared to conventional thermal CVD processes. These advantages are further exploited by high density plasma (HDP) CVD techniques, in which dense plasma is formed at low vacuum pressures so that the plasma species are even more reactive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, high radio frequency power induces arcing in the HDP-CVD system, which results in damage and thus formation of contamination or particles in the HDP-CVD system. The contamination or particles cause defect of substrates, or even scrap thereof. Specifically, arcing may damage a chamber wall (typically a conductor) of a plasma system during plasma electron grounding through the chamber wall, and thus to form conductive contamination or particles. The conductive contamination or particles may be fallen on the substrates, and arcing may occur at the conductive contamination or particles due to point discharge, resulting in defect of the substrates, or even scrap thereof.

In view of the foregoing, the present application provides a liner for a plasma system. The liner is installed in a chamber of the plasma system and configured to separate a chamber wall of the chamber from a plasma processing area, so as to prevent the damage due to the arcing.

Figure 1:
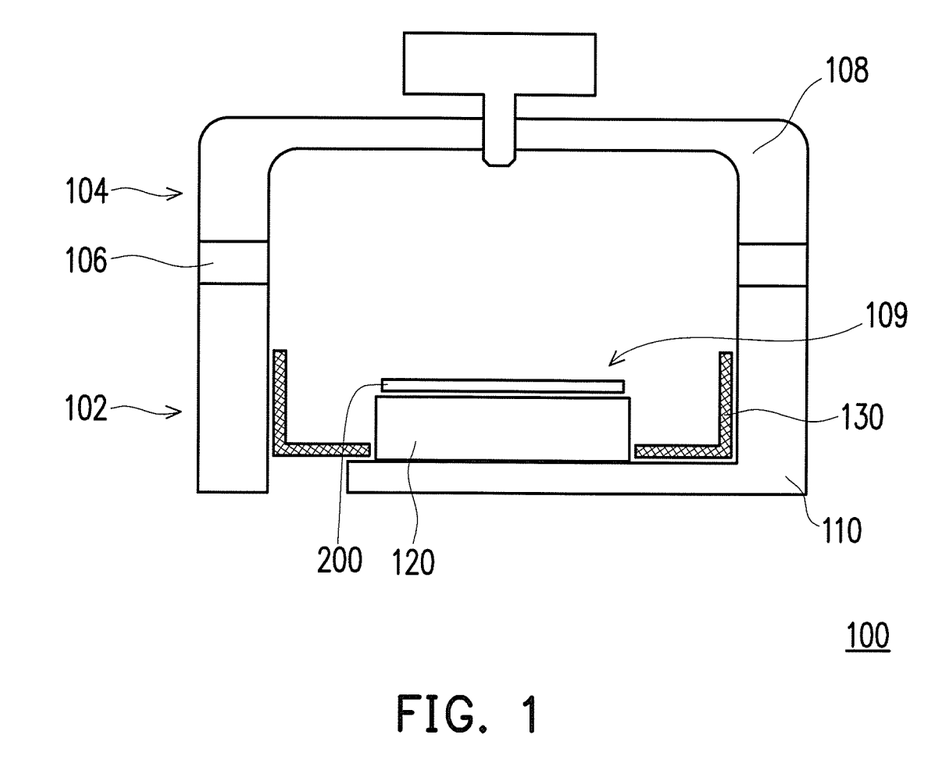
FIG. 1 is a simplified diagram of a chamber of a plasma system according to some embodiments of the present disclosure.

FIG. 1 is a simplified diagram of a chamber 100 of a plasma system according to some embodiments of the present disclosure. In some embodiments, the plasma system is a high density plasma (HDP) system. The term "high density" is understood in this context to mean having an ion density that is equal to or exceeds $10^{11}$ ions/cm$^3$. In some embodiments, the high density plasma system is a high density plasma chemical vapor deposition (HDP-CVD) system. In some embodiments, the high density plasma chemical vapor deposition system is configured to form a shallow trench isolation (STI). In some embodiments, the high density plasma chemical vapor deposition system is configured to form a phosphosilicate glass (PSG).

As shown in FIG. 1, the chamber 100 includes a chamber wall 110, a substrate supporter 120 and a liner 130. The chamber wall 110 defines a plasma processing area 109. Specifically, the chamber 100 may be divided into a lower chamber 102 and an upper chamber 104, and a gas ring 106 is floating mounted between the lower chamber 102 and the upper chamber 104. The upper chamber 104 may include a dome 108. In some embodiments, the dome 108 is made of a ceramic dielectric material, such as aluminum oxide, aluminum nitride, any other suitable material or a combination thereof. The upper chamber 16 defines an upper boundary of a plasma processing area 109. The substrate support 120 and the lower chamber 102 define a lower boundary of the plasma processing area 109. Herein, the chamber wall 110 of the present embodiment is referred to the inner side wall of the lower chamber 102. The substrate support 12 is configured to support a substrate 200 in the plasma processing area 109. In some embodiments, the substrate 200 has a diameter in a range of 200 mm to 450 mm. In some embodiments, the substrate 200 has a diameter of 200 mm, 300 nm or 450 mm. In some embodiments, the substrate supporter 120 includes is an electrostatic chuck (ESC) beneath the substrate 200 that secures the substrate 200 to the substrate support 120 during processing. In some embodiments, the substrate support 120 is made of aluminum oxide, aluminum nitride, any other aluminum ceramic material or a combination thereof.

Figure 2:
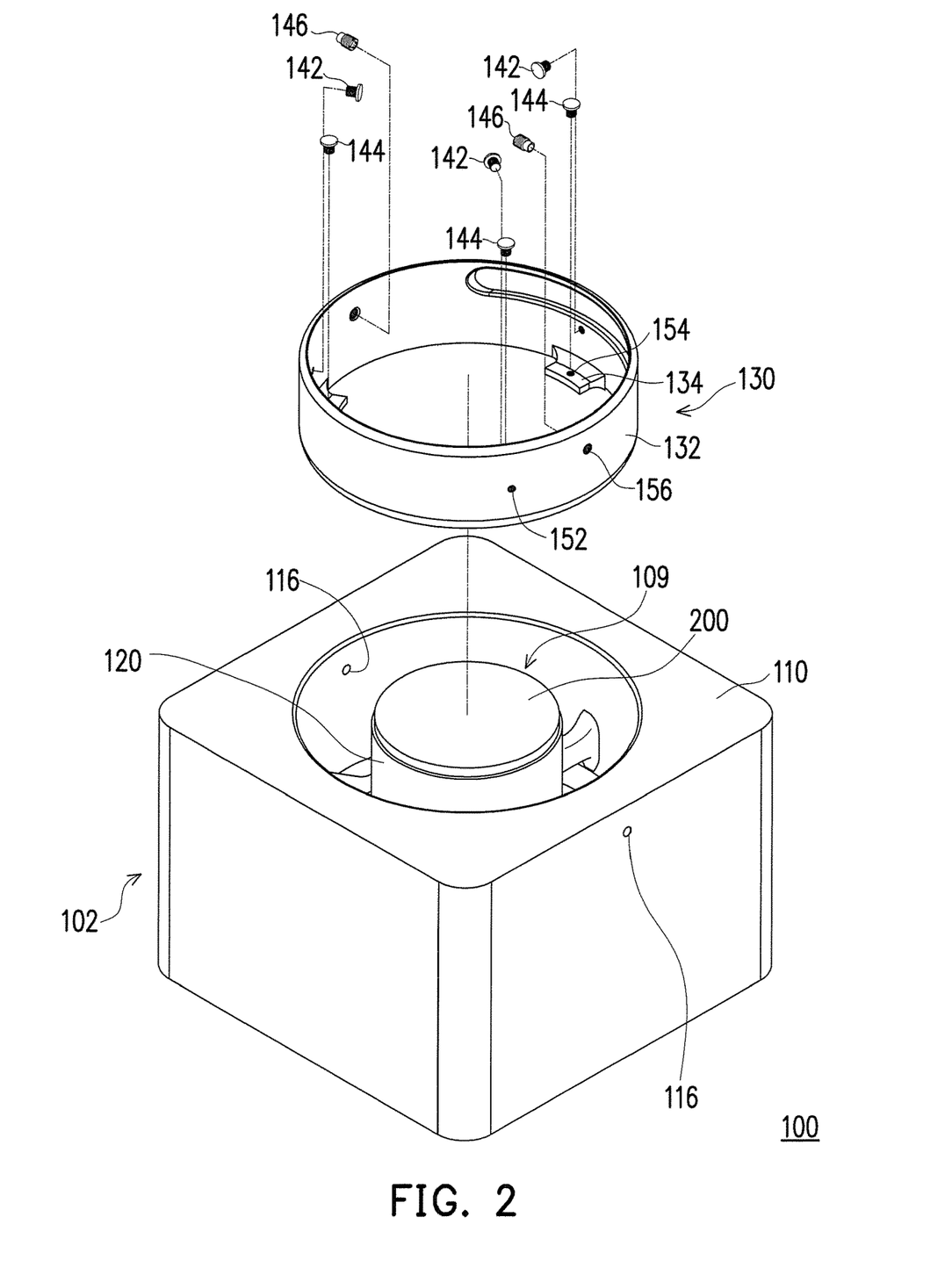
FIG. 2 is a simplified exploded view of the chamber of FIG. 1.

FIG. 2 is a simplified exploded view of the chamber 100, wherein the upper chamber 104 and the gas ring 106 are omitted in FIG. 2 for clearly showing other components such as the liner 130 and the lower chamber 102. As shown in FIGS. 1 and 2, the liner 130 is installed in the chamber 100 of the plasma system and configured to separate the chamber wall 110 from the plasma processing area 109, so as to prevent the damage due to the arcing. In some embodiments, the liner 130 may be fixed to the lower chamber 102 through first screws 142 and 144. More specifically, the liner 130 may be provided with first screw holes 152 on its side wall 132 and first screw holes 154 on its bottom tabs 134. The first screws 142 may be configured to be screwed through the side wall 132 of the liner 130 via the first screw holes 152. In addition, the first screws 144 may be configured to be screwed through the bottom tabs 134 of the liner 130 via the first screw holes 154. In some embodiments, the first screws 142 and 144 may be vespel screws or other applicable types of screws.

Figure 3:
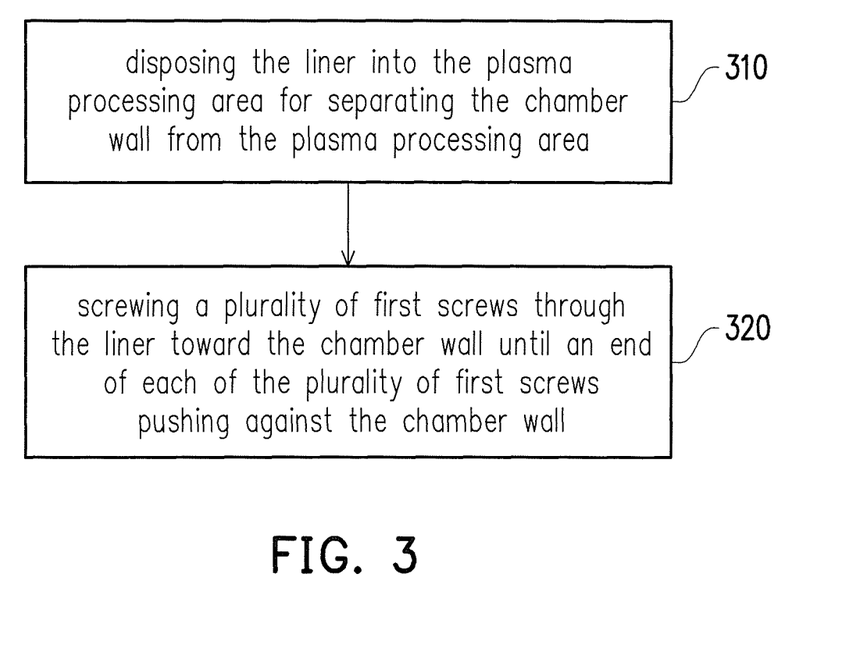
FIG. 3 is a diagram showing the steps of installing a liner to a plasma system according to some embodiments of the present disclosure.
Figure 4:
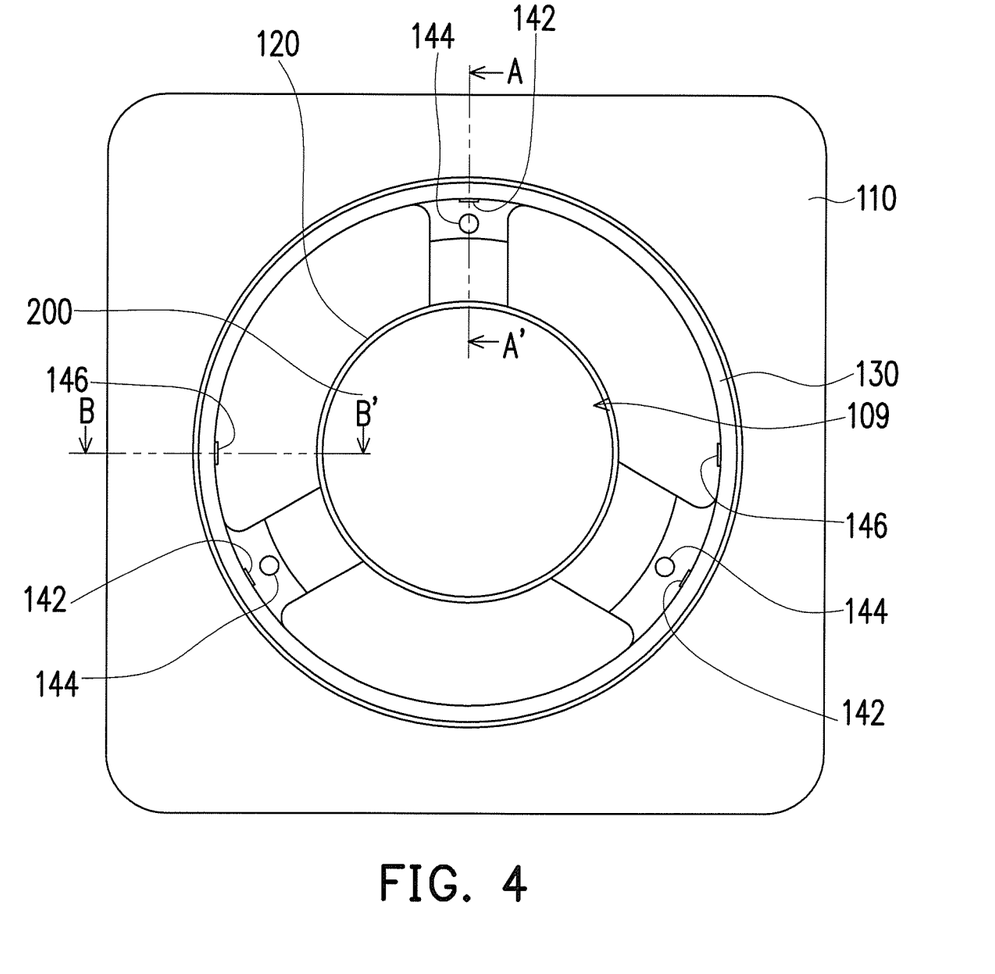
FIG. 4 is a simplified top view of the chamber of FIG. 2 according to some embodiments of the present disclosure.
Figure 5:
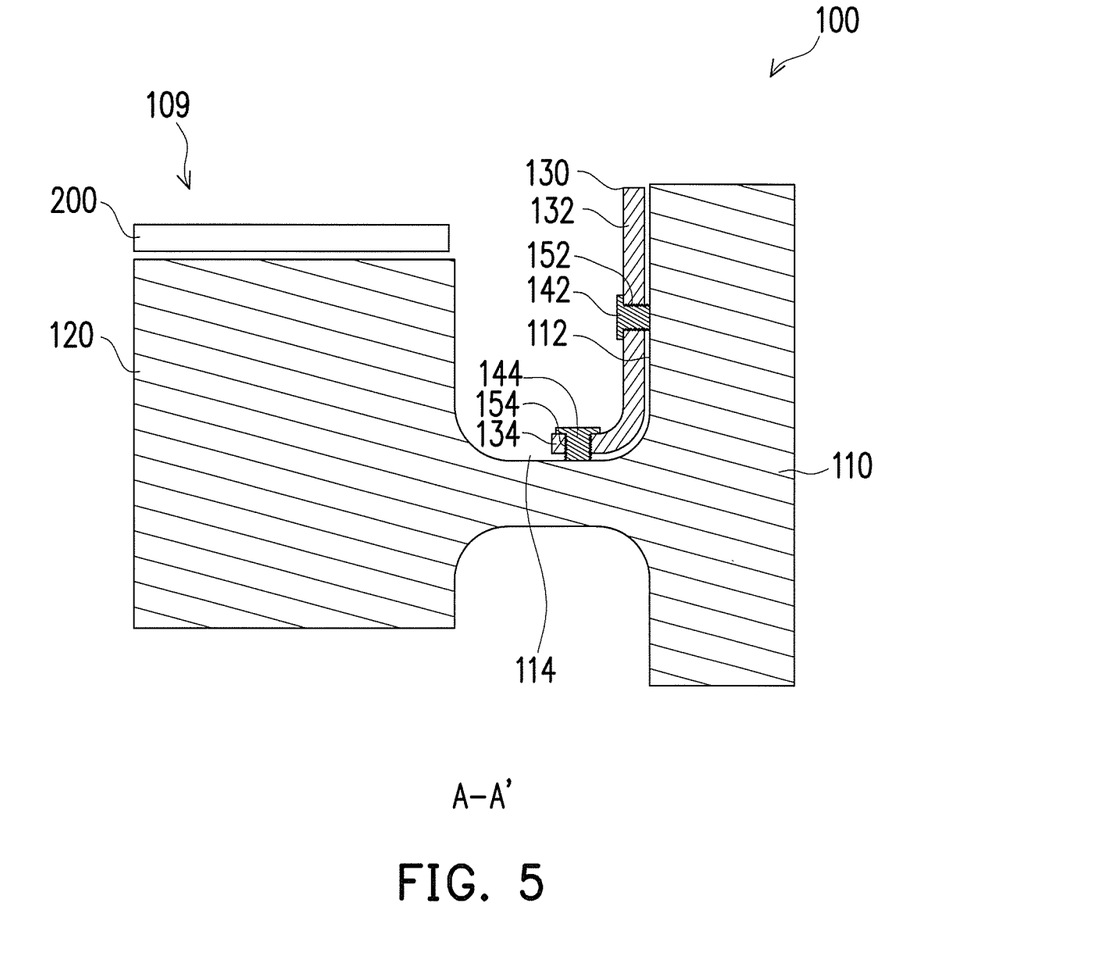
FIG. 5 is a simplified cross-sectional view along line A-A' in FIG. 4 according to some embodiments of the present disclosure.

FIG. 3 is a diagram showing the steps of installing the liner 130 to the plasma system according to some embodiments of the present disclosure. FIG. 4 is a simplified top view of the chamber 100 of FIG. 2 according to some embodiments of the present disclosure. FIG. 5 is a simplified cross-sectional view along line A-A' in FIG. 4 according to some embodiments of the present disclosure. In some embodiments, the relative position of the liner 130 with respect to the chamber wall 110 may be adjusted by screwing the first screws 142 and 144. Referring to FIGS. 3-5, the liner 130 is disposed into the plasma processing area 109 of the chamber 100 for separating the chamber wall 110 from the plasma processing area 109 (Step 310). Then, the first screws 142 are screwed through the side wall 132 of the liner 130 via the first screw holes 152 from an inner side of the liner 130 toward the chamber wall 110 until an end of each of the first screws 142 pushes against a side surface 112 of the chamber wall 110 (Step 320). In addition, the first screws 144 are screwed through the bottom tabs 134 of the liner 130 via the first screw holes 154 from an inner side of the liner 130 toward the chamber wall 110 until an end of each of the first screws 144 pushes against a bottom surface 114 of the chamber wall 110 (Step 320).

In some embodiments, the first screws 142 and 144 may be respectively preinstalled into the first screw holes 152 and 154 before disposing the liner 130 into the chamber 100. Alternatively, the first screws 142 and 144 may be installed into the first screw holes 152 and 154 until the liner 130 is disposed in the chamber 100. More specifically, a horizontal position of the liner 130 can be adjusted through the first screws 142 for centering or positioning the liner 130 with respect to the chamber wall 110. Furthermore, the liner 130 is fixed in the chamber 100 by reactive forces F from the chamber wall 110 to the first screws 142 when the first screws 142 push against the side surface 112 of the chamber wall 110. On the other hand, height or inclination of the liner 130 with respect to the chamber wall 110 may be adjusted by screwing the first screws 144 through the bottom tabs 134 of the liner 130 toward the bottom surface 114 of the chamber wall 110. Additionally, in some embodiments, the liner 130 is spaced from the chamber wall 110 of the chamber 100 by the first screws 142 and 144.

Figure 6:
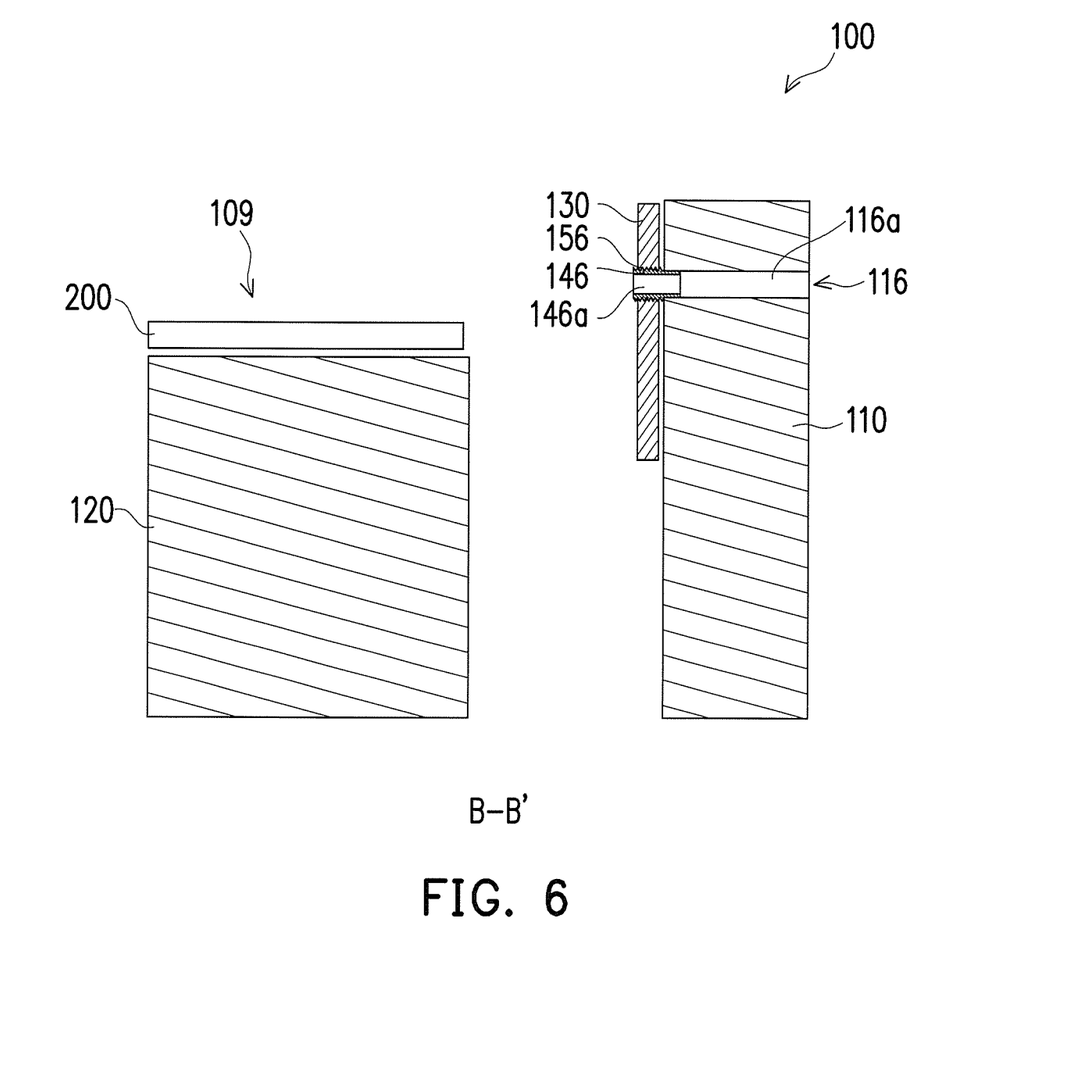
FIG. 6 is a simplified cross-sectional view along line B-B' in FIG. 4 according to some embodiments of the present disclosure.

In some embodiments, the chamber wall 110 of the chamber 100 may include two or more view ports 116 as shown in FIG. 2. For example, there are two view ports 116 respectively located at two opposite sides of the chamber wall 110. In addition, the liner 130 may be provided with two or more second screw holes 156 corresponding to the view ports 116. FIG. 6 is a simplified cross-sectional view along line B-B' in FIG. 4 according to some embodiments of the present disclosure. Two or more second screws 146 are screwed through the liner 130 via the second screw holes 156, and an end of each of the second screws 146 is inserted into a first through hole 116a passing through the corresponding view port 116. This helps the liner 130 to be supported and fixed in the chamber 100. In some embodiments, the second screws 146 may be vespel screws or other applicable types of screws.

Figure 7:
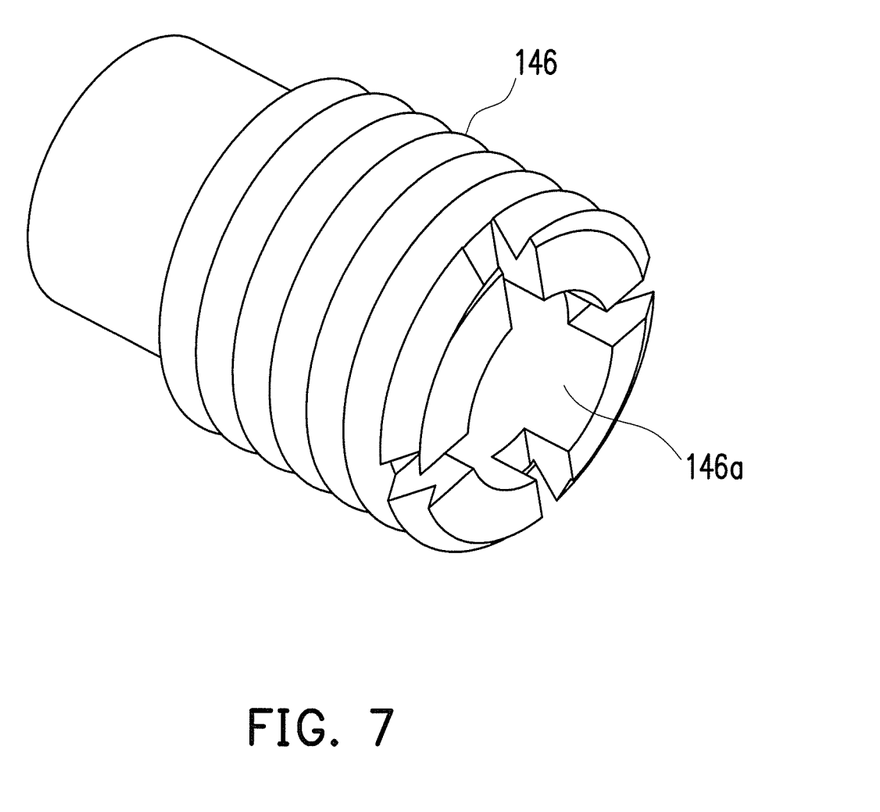
FIG. 7 is a simplified diagram of a second screw according to some embodiments of the present disclosure.

FIG. 7 is a simplified diagram of one of the second screws 146 according to some embodiments of the present disclosure. As shown in FIGS. 6 and 7, in some embodiments, each of the second screws 146 may be provided with a second through hole 146a, and thus the plasma processing area 109 and the first through hole 116a of the corresponding view port 116 can be communicated through the second through hole 146a when the second screw 146 is inserted in to the second through hole 146a. In other words, the view ports 116 of the chamber 100 are still available for observing or monitoring plasma process in the plasma process area 109 through the second through holes 146a of the second screws 146 in the case that the second screws 146 are inserted into the view ports 116.

Figure 8:
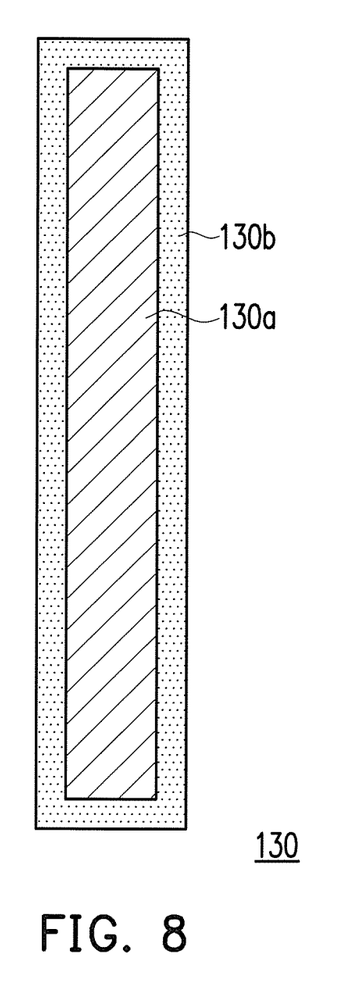
FIG. 8 is a simplified cross-sectional view of a liner according to some embodiments of the present disclosure.

FIG. 8 is a simplified cross-sectional view of the liner 130 according to some embodiments of the present disclosure. The liner 130 is provided with a non-conductive surface to prevent arcing in the chamber 100 of the plasma system. In some embodiments, the liner 130 includes a liner body 130a and an insulating protective layer 130b covering the liner body 130a. In some embodiments, the liner body 130a includes any suitable metal or alloy, such as aluminum, magnesium, titanium, any other suitable metal or alloy, or a combination thereof.

The insulating protective layer 130b is configured to isolate the liner body 130a from the plasma, and thus to prevent the damage due to the arcing. In some embodiments, the insulating protective layer 130b is formed by micro arc plasma oxidation (MAPO) or other applicable techniques and may be a crystalline metal oxide layer or an amorphous metal oxide layer. In some embodiments, the crystalline metal oxide layer includes crystalline aluminum oxide, crystalline magnesium oxide, crystalline titanium oxide, any other suitable crystalline metal oxide or a combination thereof. In some embodiments, the crystalline aluminum oxide includes α-aluminum oxide, γ-aluminum oxide or a combination thereof.

In some embodiments, the insulating protective layer 130b excludes crystal water, and thus is suitable for use in the plasma system. If there is crystal water existed in the insulating protective layer 130b, it may affect the environment of the plasma processing area 109.

In some embodiments, the insulating protective layer 130b has a Vickers-hardness higher than or equal to 800, such that the insulating protective layer 130b can exhibit good anti-abrasion property. In some embodiments, the insulating protective layer 130b has a Vickers-hardness in a range of 800 to 1,500.

In some embodiments, the insulating protective layer 130b has a breakdown voltage greater than or equal to 900 V; that is, the insulating protective layer 130b possesses high voltage breakdown resistance. In some embodiments, the insulating protective layer has a breakdown voltage as high as 1,200 V.

In some embodiments, the insulating protective layer 130b has a thickness greater than or equal to 20 µm. In some embodiments, the thickness of the insulating protective layer 130b is in a range of 20 µm to 50 µm. In practical applications, the thickness of the insulating protective layer 130b may be adjusted to achieve enough breakdown voltage.

In some embodiments, the plasma system may be high density plasma chemical vapor deposition system including a radio frequency generator configured to provide a radio frequency power greater than or equal to 6,000 watts. In some embodiments, the radio frequency power is greater than or equal to 9,000 watts. In some embodiments, the high density plasma chemical vapor deposition system further includes a source plasma system (not shown) and a bias plasma system (not shown). In some embodiments, the source plasma system includes a top source radio frequency generator (not shown) and a side source radio frequency generator (not shown). In some embodiments, the top source radio frequency generator is configured to provide a radio frequency power greater than or equal to 6,000 watts. In some embodiments, the side source radio frequency generator is configured to provide a radio frequency power greater than or equal to 6,000 watts. In some embodiments, the top source radio frequency generator and the side source radio frequency generator are respectively coupled to a top of the dome 108 and a side thereof. In some embodiments, the bias plasma system includes a bias radio frequency generator (not shown). In some embodiments, the bias radio frequency generator is configured to provide a radio frequency power greater than or equal to 6,000 watts.

In some embodiments, the high density plasma chemical vapor deposition system further includes a vacuum system (not shown) configured to control chamber pressure. In some embodiments, the vacuum system includes throttle valve, gate valve and a turbo-molecular pump.

In some embodiments, the high density plasma chemical vapor deposition system further includes a remote plasma cleaning system (not shown) configured to clean deposition residues from chamber components. In some embodiments, the remote plasma cleaning system includes a remote microwave generator that creates plasma from a cleaning gas source (e.g., molecular fluorine, nitrogen, nitrogen fluoride, other fluorocarbons, any other suitable material or a combination thereof) in reactor cavity (not shown). The reactive species resulting from this plasma are conveyed to the chamber 100 through a cleaning gas feed port (not shown) via an applicator tube (not shown).

A method of manufacturing a liner of a plasma system, such as the liner 130 of the previous embodiments, is further described below. In some embodiments, the plasma system is a high density plasma system. In some embodiments, the high density plasma system is a high density plasma chemical vapor deposition system. The method includes receiving an aluminum-containing liner body, such as the liner body 130a of FIG. 8. In some embodiments, the aluminum-containing liner body is made of aluminum. Then, an aluminum oxide-containing layer, such as the insulating protective layer 130b of FIG. 8, is then formed covering a surface of the aluminum-containing liner body. In some embodiments, the aluminum oxide-containing layer is formed using anodic oxidation treatment, micro arc plasma oxidation (MAPO), atmospheric plasma oxidation, thermal plasma oxidation, thermal oxidation, any other suitable oxidation or a combination thereof. In some embodiments, the aluminum oxide-containing layer includes crystalline aluminum oxide, amorphous aluminum oxide or a combination thereof.

In some embodiments, the aluminum oxide-containing layer is formed by performing the anodic oxidation treatment on the aluminum-containing liner body. The aluminum oxide-containing layer is formed through chemical oxidation and electrochemical oxidation during the anodic oxidation treatment, wherein the aluminum-containing liner body is acted as an anode, and a stainless steel is acted as a cathode.

In some embodiments, the aluminum-containing liner body is dipped in an acidic electrolyte solution, and the aluminum-containing liner body is then electrified in the acidic electrolyte solution to form the aluminum oxide-containing layer covering the surface of the aluminum-containing liner body. In some embodiments, the acidic electrolyte solution includes sulfuric acid, chromic acid, oxalic acid or a combination thereof, which has a concentration in a range of 3 g/l to 25 g/l.

In some embodiments, the aluminum-containing liner body is dipped in an electrolyte solution, and the aluminum-containing liner body is then electrified in the electrolyte solution to form the aluminum oxide-containing layer covering the surface of the aluminum-containing liner body, in which the electrolyte solution is at a temperature less than 5° C.

In some embodiments, the aluminum oxide-containing layer formed using the anodic oxidation treatment includes crystal water. In some embodiments, the aluminum oxide-containing layer formed using the anodic oxidation treatment includes the amorphous aluminum oxide.

In some embodiments, the aluminum oxide-containing layer is formed by performing the micro arc plasma oxidation on the aluminum-containing liner body. The micro arc plasma oxidation is also called as plasma electrolytic oxidation or anodic spark deposition. In some embodiments, the aluminum-containing liner body is acted as an anode, and a stainless steel is acted as a cathode. In some embodiments, the micro arc plasma oxidation is performed with a current greater than that of the anodic oxidation treatment. In some embodiments, the micro arc plasma oxidation is applied with a voltage greater than that of the anodic oxidation treatment. In some embodiments, the micro arc plasma oxidation is performed at a temperature greater than that of the anodic oxidation treatment. The aluminum oxide-containing layer is formed through chemical oxidation, electrochemical oxidation and high temperature plasma oxidation during the micro arc plasma oxidation. Specifically, an aluminum oxide thin film is firstly formed, and then broken by high voltage to form a plasma region with high temperature and high pressure. The aluminum adjacent to the plasma region will be melted, and the electrolyte solution adjacent thereto will be vaporized due to the plasma region. The melted aluminum will be reacted with oxygen free radical to form the aluminum oxide-containing layer including the crystalline aluminum oxide. In some embodiments, the crystalline aluminum oxide includes α-aluminum oxide, γ-aluminum oxide or a combination thereof.

In some embodiments, the aluminum-containing liner body is dipped in a basic electrolyte solution, and the aluminum-containing liner body is then electrified in the basic electrolyte solution to form the aluminum oxide-containing layer covering the surface of the aluminum-containing liner body. In some embodiments, the basic electrolyte solution includes sodium silicate, sodium aluminate, sodium phosphate or a combination thereof, which has a concentration in a range of 3 g/l to 25 g/l. In some embodiments, the basic electrolyte solution further includes sodium hydroxide, potassium hydroxide or a combination thereof, which has a concentration in a range of 3 g/l to 25 g/l.

In some embodiments, the aluminum-containing liner body is dipped in an electrolyte solution, and the aluminum-containing liner body is then electrified in the electrolyte solution to form the aluminum oxide-containing layer covering the surface of the aluminum-containing liner body, in which the electrolyte solution is at a temperature in a range of 5° C. to 50° C. In some embodiments, the electrolyte solution is at a temperature in a range of 20° C. to 50° C.

A method of manufacturing a liner for a plasma system, such as the liner 130 of the previous embodiments, is further described below. In some embodiments, the plasma system is a high density plasma system. In some embodiments, the high density plasma system is a high density plasma chemical vapor deposition system. The method includes receiving a metal liner body, such as the liner body 130*a* of FIG. 8. In some embodiments, the metal liner body includes aluminum, magnesium, titanium or a combination thereof. Then, a crystalline metal oxide-containing layer, such as the insulating protective layer 130*b* of FIG. 8, is then formed covering a surface of the metal liner body. In some embodiments, the crystalline metal oxide-containing layer is formed using micro arc plasma oxidation, atmospheric plasma oxidation, thermal plasma oxidation, thermal oxidation, any other suitable oxidation or a combination thereof.

In some embodiments, the crystalline metal oxide-containing layer is formed by performing the micro arc plasma oxidation on the metal liner body. In some embodiments, the metal liner body is acted as an anode, and a stainless steel is acted as a cathode. The crystalline metal oxide-containing layer is formed through chemical oxidation, electrochemical oxidation and high temperature plasma oxidation during the micro arc plasma oxidation. Specifically, a metal oxide thin film is firstly formed, and then broken by high voltage to form a plasma region with high temperature and high pressure. The metal adjacent to the plasma region will be melted, and the electrolyte solution adjacent thereto will be vaporized due to the plasma region. The melted metal will be reacted with oxygen free radical to form the crystalline metal oxide-containing layer. In some embodiments, the crystalline metal oxide-containing layer includes crystalline aluminum oxide, crystalline magnesium oxide, crystalline titanium oxide or a combination thereof. In some embodiments, the crystalline aluminum oxide includes α-aluminum oxide, γ-aluminum oxide or a combination thereof.

In some embodiments, the metal liner body is dipped in a basic electrolyte solution, and the metal liner body is then electrified in the basic electrolyte solution to foil 1 the crystalline metal oxide-containing layer covering the surface of the metal liner body. In some embodiments, the basic electrolyte solution includes sodium silicate, sodium aluminate, sodium phosphate or a combination thereof, which has a concentration in a range of 3 g/l to 25 g/l. In some embodiments, the basic electrolyte solution further includes sodium hydroxide, potassium hydroxide or a combination thereof, which has a concentration in a range of 3 g/l to 25 g/l.

In some embodiments, the metal liner body is dipped in an electrolyte solution, and the metal liner body is then electrified in the electrolyte solution to form the crystalline metal oxide-containing layer covering the surface of the metal liner body, in which the electrolyte solution is at a temperature in a range of 5° C. to 50° C. In some embodiments, the electrolyte solution is at a temperature in a range of 20° C. to 50° C.

According to some embodiments, a chamber of a plasma system includes a chamber wall defining a plasma processing area, a substrate supporter configured to support a substrate in the plasma processing area, and a liner located in the plasma processing area and separating the chamber wall from the plasma processing area.

According to some embodiments, a liner for a plasma system is provided, wherein the plasma system includes a chamber wall defining a plasma processing area and a substrate supporter configured to support a substrate in the plasma processing area. The liner includes a liner body and an insulating protective layer covering the liner body for separating the chamber wall from the plasma processing area.

According to some embodiments, a method for installing a liner to a plasma system is provided, wherein the plasma system includes a chamber wall defining a plasma processing area and a substrate supporter configured to support a substrate in the plasma processing area. The method includes disposing the liner into the plasma processing area for separating the chamber wall from the plasma processing area, and screwing a plurality of first screws through the liner toward the chamber wall until an end of each of the plurality of first screws pushing against the chamber wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chamber of a plasma system, comprising:
    a lower chamber and an upper chamber defining a plasma processing area;
    a substrate supporter configured to support a substrate in the plasma processing area; and
    a liner located in the lower chamber and separating a chamber wall from the plasma processing area, wherein the liner has a side wall and a plurality of bottom tabs, the side wall is a ring surrounding along an inner sidewall of the lower chamber, the plurality of bottom tabs is connected to and extend from a bottom of the side wall toward the substrate supporter, the plurality of bottom tabs are spaced from each other, the liner is fixed to a bottom surface of the chamber wall in the lower chamber by screwing a plurality of first screws through the plurality of bottom tabs, and a topmost surface of the liner is lower than a topmost surface of the lower chamber.

2. The chamber of claim 1, wherein the liner comprises a liner body and an insulating protective layer covering the liner body.

3. The chamber of claim 2, wherein the insulating protective layer comprises a metal oxide layer.

4. The chamber of claim 1, wherein each of the plurality of first screws has an end pushing against the chamber wall.

5. The chamber of claim 4, wherein the liner is spaced from the chamber wall by the plurality of first screws.

6. The chamber of claim 4, wherein the chamber wall comprises a plurality of view ports, the chamber further comprises a plurality of second screws screwed through the liner, and each of the plurality of second screws has an end inserted into a first through hole passing through the corresponding view port.

7. The chamber of claim 6, wherein the plurality of view ports comprises two view ports respectively located at two opposite sides of the chamber wall.

8. The chamber of claim 6, wherein each of the second screws is provided with a second through hole communicating the plasma processing area and the first through hole.

9. A liner for a plasma system, wherein the plasma system comprises a chamber, the chamber comprises a lower chamber and an upper chamber defining a plasma processing area and a substrate supporter configured to support a substrate in the plasma processing area, the liner located in the lower chamber comprising:
   a liner body; and
   an insulating protective layer covering the liner body, for separating a chamber wall from the plasma processing area, wherein the liner has a side wall and a plurality of bottom tabs, the side wall is a ring surrounding along an inner sidewall of the lower chamber, the plurality of bottom tabs is connected to and extend from a bottom of the side wall toward the substrate supporter, the plurality of bottom tabs are spaced from each other, the liner is fixed to a bottom surface of the chamber wall in the lower chamber by screwing a plurality of first screws through the plurality of bottom tabs, and a topmost surface of the liner is lower than a topmost surface of the lower chamber.

10. The liner of claim 9, wherein the insulating protective layer comprises a metal oxide layer.

11. The liner of claim 9, wherein the liner body comprises aluminum, magnesium, titanium or a combination thereof.

12. The liner of claim 9, wherein the liner is provided with a plurality of first screw holes configured to be passed through by the plurality of first screws, and each of the plurality of first screws has an end pushing against the chamber wall.

13. The liner of claim 9, wherein the liner is provided with a plurality of second screw holes configured to be passed through a plurality of second screws, and each of the plurality of second screws has an end inserted into a first through hole passing through a view port of the chamber wall.

14. The liner of claim 13, wherein the plurality of second screw holes comprises two second screw holes respectively located at two opposite sides of the liner.

15. A method for installing a liner to a plasma system, wherein the plasma system comprises a chamber, the chamber comprises a lower chamber and an upper chamber defining a plasma processing area and a substrate supporter configured to support a substrate in the plasma processing area, the method comprising:
   disposing the liner into the lower chamber for separating a chamber wall from the plasma processing area, wherein the liner has a side wall and a plurality of bottom tabs, the side wall is a ring surrounding along an inner sidewall of the lower chamber, the plurality of bottom tabs is connected to and extend from a bottom of the side wall toward the substrate supporter, the plurality of bottom tabs are spaced from each other, and a topmost surface of the liner is lower than a topmost surface of the lower chamber; and
   screwing a plurality of first screws through the plurality of bottom tabs of the liner to fix the liner onto a bottom surface of the chamber wall until an end of each of the plurality of first screws pushing against the chamber wall.

16. The method of claim 15, wherein the relative position of the liner with respect to the chamber wall is adjusted during the step of screwing the plurality of first screws through the liner toward the chamber wall.

17. The method of claim 15, further comprising spacing the liner from the chamber wall by the plurality of first screws.

18. The method of claim 15, further comprising screwing a plurality of second screws through the liner toward the chamber wall until an end of each of the plurality of second screws is inserted into a first through hole passing through a view port of the chamber wall.

19. The method of claim 18, wherein each of the second screws is provided with a second through hole communicating the plasma processing area and the first through hole.

20. The chamber of claim 1, further comprising a gas ring floating mounted between the lower chamber and the upper chamber.

* * * * *